(12) United States Patent
Maeda

(10) Patent No.: US 6,463,005 B2
(45) Date of Patent: Oct. 8, 2002

(54) SEMICONDUCTOR MEMORY DEVICE

(75) Inventor: Kazunori Maeda, Tokyo (JP)

(73) Assignee: NEC Corporation, Tokyo (JP)

( * ) Notice: Subject to any disclaimer, the term of this patent is extended or adjusted under 35 U.S.C. 154(b) by 59 days.

(21) Appl. No.: 09/764,481

(22) Filed: Jan. 17, 2001

(65) Prior Publication Data

US 2001/0008282 A1 Jul. 19, 2001

(30) Foreign Application Priority Data

Jan. 18, 2000 (JP) ........................ 2000-009038

(51) Int. Cl.[7] .................................. G11C 8/00
(52) U.S. Cl. .................... 365/233; 365/230.06
(58) Field of Search .................... 365/233, 230.03, 365/230.08, 230.01, 230.06

(56) References Cited

U.S. PATENT DOCUMENTS 5,493,535 A * 2/1996 Cho ................ 365/230.04
6,009,036 A * 12/1999 Takasugi ........... 365/230.01
6,094,375 A * 7/2000 Lee ................. 365/189.04

FOREIGN PATENT DOCUMENTS

JP 09-063263 3/1997
JP 11-039871 2/1999

* cited by examiner

Primary Examiner—Richard Elms
Assistant Examiner—Anh Phung
(74) Attorney, Agent, or Firm—Darryl G. Walker

(57) ABSTRACT

A semiconductor memory device, such as a SDRAM operating in a multi-bit prefetch mode, having reduced on chip noise associated with the switching of signal lines is disclosed. According to one embodiment, the semiconductor memory device may include first and second memory cell segments (201 and 202). A first Y-address buffer decoder 100-1 can be connected to the first memory cell segment 201 and a second Y-address buffer decoder 100-2 can be connected to the second memory cell segment 202. The first Y-address decoder 100-1 receives a Y-address and a first latch signal CLK1. The second Y-address decoder 100-2 receives a Y-address and a second latch signal CLK2. A clock generating circuit 400 receives an external clock signal CLK and synchronously generates the first and second latch signals (CLK1 and CLK2). The first and second latch signals (CLK1 and CLK2) are staggered with respect to each other, so as to reduce on chip noise associated with the switching of column switch lines (YSW1 and YSW2) and I/O buses (RWBS1 and RWBS2) and the activation of associated circuitry.

20 Claims, 10 Drawing Sheets

SEMICONDUCTOR MEMORY DEVICE

TECHNICAL FIELD

The present invention relates generally to semiconductor memory devices, and more particularly to synchronous semiconductor memory devices having access to a memory cell array based on an n-bit prefetch mode.

BACKGROUND OF THE INVENTION

In a synchronous semiconductor memory device it is desirable to operate the device at a high external clock frequency. As a result, the synchronous memory device may have to be capabile of being read from and written to at high speeds. One method of increasing the speed in accessing a synchronous memory device is by using an n-bit prefetch (n is an integer greater than 1) whereby n-bits of data are accessed from the memory array at a first portion of a read operation and then synchronously output from the synchronous memory device on subsequent clock cycles. Examples of a 2-bit prefetch operation in a synchronous semiconductor memory device are disclosed in Japanese Patent Application Laid-Open No. Hei 9-63263 (Semiconductor Memory Device) and Japanese Patent Application Laid-Open No. Hei 11-39871 (Synchronous Type Semiconductor Memory Device).

One such example of a synchronous semiconductor memory device is a Synchronous Dynamic Random Access Memory (SDRAM). To better understand the various aspects of the present invention a conventional 2-bit prefetch operation will be described with respect to a SDRAM. Referring now to FIG. 15, a SDRAM with a conventional 2-bit prefetch operation is set forth. The SDRAM of FIG. 15 includes a Y-address buffer decoder 100, a memory cell array 200, and sense amplifiers (301 (AMP1) and 302 (AMP2)). The memory cell array 200 is divided into memory cell segments (201 and 202) with each memory cell segment (201 and 202) being equal halves of the memory cell array 200.

The Y-address buffer 100 receives a Y-address (column address) signal and an external master clock signal (CLK) from outside the chip or integrated circuit. Based on the value of the Y-address signal, the Y-address buffer decoder 100 activates a column switch line from a group of column switch lines YSW1 corresponding to the memory cell segment 201 and a column switch line from a group of column switch lines YSW2 corresponding to the memory cell segment 202. The column switch line is activated synchronously with the clock signal CLK.

The column switch lines YSW1 and YSW2 designate even column switch lines (YSW1) and odd column switch lines (YSW2). Thus, when the Y-address buffer decoder 100 receives an even Y-address value (Y), the Y-address buffer decoder 100 activates a column switch line, which corresponds to the Y-address value (Y), from the group of column switch lines YSW1. Also, at the same time, the Y-address buffer decoder 100 activates a column switch line, which corresponds to the Y address value (Y+1), from the group of column switch lines YSW2.

However, when the Y-address buffer decoder 100 receives an odd Y-address value (Y), the Y-address buffer decoder 100 activates a column switch line, which corresponds to the Y-address value (Y), from the group of column switch lines YSW2. Also, at the same time, the Y-address buffer decoder 100 activates a column switch line, which corresponds to the Y address value (Y+1), from the group of column switch lines YSW1.

Thus, a memory cell from both memory cell segments (201 and 202) can be simultaneously accessed constituting a 2-bit prefetch. The 2 prefetched bits correspond to bits with consecutive column addresses. The memory cell array 200 is divided into two equal halves where each half corresponds to a memory cell segment (201 or 202). Memory cell segment 201 contains only memory cells that have even column addresses and memory cell segment 202 contains only memory cells that have odd column addresses.

Additionally, an X-address (row address) buffer decoder (not shown) is coupled to the memory cell segments (201 and 202) to activate a row of memory cells in each memory cell segment (201 and 202). For example, a X-address signal is received externally from the SDRAM and used to activate a word line (not shown) in each memory cell segment (201 and 202). Then, based on the Y-address signal (column address) received externally from the SDRAM, a column switch line is selected from each of the groups of column switch lines (YSW1 and YSW2) to access a bit with an even column address from memory cell segment 201 and a bit with an odd column address from memory cell segment 202. These accessed memory cells have a row address which corresponds to the value of the received X-address signal and column addresses which correspond to the value of the received Y-address signal (Y) for one bit and (Y+1) for the other bit.

In the 2-bit prefetch operation, the 2 prefetched bits, which have consecutive column address values, will be simultaneously accessed on I/O buses (RWBS1 and RWBS2) by way of sense amplifiers (301 and 302) and thus a processor can gain access (read/write) to them on successive clock CLK cycles.

Referring now to FIG. 16(a), a timing diagram illustrating the 2-bit prefetch read operation of the SDRAM of FIG. 15 is set forth. In the read operation, a row address signal (not shown) and column address signal (not shown) are applied externally to the SDRAM synchronously with the clock signal CLK having a period of Tclk. The row address signal activates a word line in each memory cell segment (201 and 202). The read operation is a 4-bit burst read with the beginning bit identified by the externally applied row and column address signals. When data in the form of a burst is written to or read from a SDRAM in a prefetch mode, the address values accessed by the column switch lines (YSW1 and YSW2) will differ depending whether a sequential or interleaved count mode is used as designated by an external control signal and the externally applied column address. For simplicity, it is assumed that the SDRAM is operating in the sequential count mode and that the least significant bit of the externally applied column address is a zero. The accessed column addresses A1–A4 are sequential addresses with one bit increment between each.

Given the above conditions address A1 is an even number, thus at time t1 a column switch line from the group of column switch lines YSW1 which corresponds to address A1 is activated. Also at time t1 a column switch line from the group of column switch lines YSW2 which corresponds to address A2 (=A1+1) is activated. DATA1 and DATA2 from memory cell segments 201 and 202 are thus output to I/O buses RWBS1 and RWBS2 respectively after a circuit propagation delay from t1.

Two clock CLK cycles later at time t3 another column switch line from the group of column switch lines YSW1 which corresponds to address A3 (=A1+2) is activated. Also at time t3 a column switch line from the group of column switch lines YSW2 which corresponds to address A4 (=A1+

3) is activated. Thus, DATA3 and DATA4 from memory cell segments 201 and 202 are thus output to I/O buses RWBS1 and RWBS2 respectively after a circuit propagation delay from t3.

The data on the I/O buses RWBS1 and RWBS2 (first DATA1 and DATA2 and then DATA3 and DATA4) are alternately latched at a predetermined timing synchronously with the clock signal CLK, and then sequentially output externally as data signals DQ synchronously with and on sequential CLK cycles.

The change of the activation of the column switch lines YSW1 and YSW2 (from A1 to A3 or from A2 to A4) during the burst cycle is performed synchronously with the external clock signal CLK by circuitry within the Y-address buffer decoder 100 and controlled by a control circuit on the SDRAM (not shown).

For the 2-bit prefetch mode as shown in FIG. 16(a) it takes two CLK cycles to access each group of prefetched data onto I/O buses (RWBS1 and RWBS2). However, data signals DQ are output every CLK cycle synchronously with CLK. Thus, the access speed to the individual memory cells occurs at a slower rate (approximately half) than the data is provided externally from the SDRAM. Because of the two clock cycle internal access window, an increase in the external clock signals will increase the data transmission rate.

Referring now to FIG. 16(b), a timing diagram illustrating a conventional non-prefetch read operation (also known as pipeline) of an SDRAM is set forth. It can be seen that both the data on the internal I/O bus RWBUS and the external data signals DQ are transmitted, synchronously with, and in a single CLK cycle. It is noted that the column switch line YSW also switches every CLK cycle.

Referring now to FIG. 17, a timing diagram illustrating the 2-bit prefetch read operation of a DDR-SDRAM (Double Data Rate SDRAM) is set forth. The read operation is a 4-bit burst read with the beginning bit identified by the externally applied row and column address signals (not shown). However, in the DDR-DRAM, the Y-address buffer decoder 100 is configured to allow operations to occur synchronously with both the rising and falling edges of each CLK signal.

For the 2-bit prefetch mode in a DDR-SDRAM as shown in FIG. 17 it takes one CLK cycle to access each group of prefetched data onto I/O buses (RWBS1 and RWBS2). However, data signals DQ are output every half CLK cycle synchronously with the rising and falling edges of CLK. Thus, the access speed to the individual memory cells occurs at a slower rate (approximately half) than the data is provided externally from the SDRAM. This will typically allow for the capability of a faster external clock CLK than in the conventional non-prefetch operation.

For the 2-bit prefetch mode, the case of the DDR-SDRAM illustrated in FIG. 17, is similar to the SDR-SDRAM (Single Data Rate SDRAM) illustrated in FIG. 16(a) in that the 2-bits prefetched in parallel requires a circuit for selecting an additional column switch line (YSW1 and YSW2). However, an SDRAM that does not prefetch the data, as illustrated in FIG. 16(b), does not require the additional column switch line (YSW1 and YSW2), but instead accesses data from the memory cell array 200 at twice the rate, which could be in as little as half the period (Tclk) of the external clock CLK in a DDR-SDRAM.

An SDRAM based on the conventional 2-bit prefetch mode activates two column switch lines (YSW1 and YSW2) simultaneously and will also require two I/O buses to become active at the same time. These requirements mean that a pair of column switch line drivers (not shown) and sense amplifiers (301 and 302) will be active for each data bit. Instances in which increased circuit activation occurs are shown with a "*" in FIGS. 16(a) and 17. In the case of a SDRAM that has 16 DQs (×16), then 32 such data path circuits will be activated which will create on chip noise due to the current spikes on the voltage supply lines and ground lines. Such noise is particularly troublesome on state of the art SDRAMs that use on-chip voltage regulators that have limited current supplying capabilities and/or have relatively narrow (thus resistive) on chip power buses. In order to minimize access times, column circuitry is activated as soon as the memory cell levels have been sufficiently "sensed" to enable data to reliably be propagated, thus current spikes during this time are undesirable because they will cause improper data transmission or delays. Such noise will be even more troublesome on a SDRAM that operates with a prefetch mode of 4-bits or even more.

In view of the above discussion, it would be desirable to provide a semiconductor memory device, such as an SDRAM that operates on a multi-bit prefetch mode, may have reduced noise when selecting multiple prefetched bits from the memory cell array.

SUMMARY OF THE INVENTION

According to the present invention, a semiconductor memory device configured to receive external control signals and external address signals synchronously with an external clock signal and permit data to be written or read synchronously with the external clock signal includes a latch circuit that receives the external clock and generates latch signals synchronously with the external clock signal with each latch signal being generated at a different time interval.

According to one aspect of the present invention, address decoders receiving an internal address signal, generate a column switch signal synchronously with a received latch signal. The semiconductor memory includes a memory array that is divided into memory array segments. Columns in the memory array segments are addressed by the address decoders at different time intervals and synchronously with the latch signals.

According to one aspect of the present invention, an internal I/O bus receives data from each memory array segment. The memory array segments deliver the data in parallel to the internal I/O buses and the data is thereafter delivered sequentially from the semiconductor memory device as an external data signal DQ. The data from the memory array segments is delivered to the internal I/O buses synchronously with the latch signals.

According to another aspect of the invention, a latch circuit receives an external clock signal, an enable signal, and a voltage reference and generates the latch signals therefrom.

According to another aspect of the invention, the latch signals are generated synchronously with respect to the external clock signal.

According to another aspect of the invention, the latch signals are generated at different time intervals.

According to another aspect of the invention, one latch signal is the logical inversion of another latch signal.

According to another aspect of the invention, the latch signals are pulses having a certain pulse width with at least two latch signals generated at different time intervals.

According to another aspect of the invention, the time interval between latch signals is determined by a delay stage in the latch circuit.

According to another aspect of the invention, the maximum time interval between adjacent latch signals is kept less than or substantially equal to the period of the external clock signal when data is written or read synchronously with a first edge of the external clock signal.

According to another aspect of the invention, the maximum time interval between adjacent latch signals is kept less than or substantially equal to one-half period of the external clock signal when data is written or read synchronously with a first and second edge of the external clock signal.

DETAILED DESCRIPTION OF THE EMBODIMENTS

Various embodiments of the present invention will now be described in detail with reference to a number of drawings.

Figure 1:
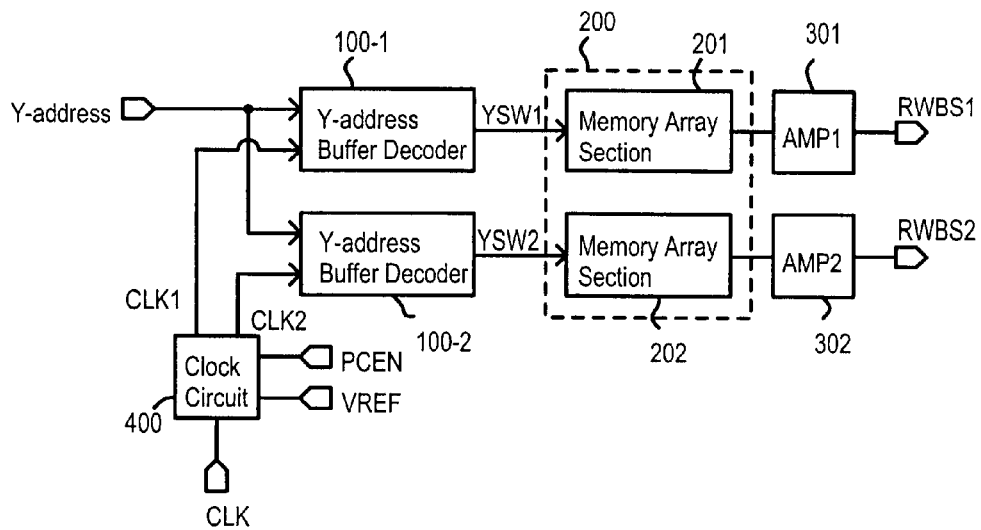
FIG. 1 is a block schematic diagram of a semiconductor memory device according to a first embodiment.
Figure 15:
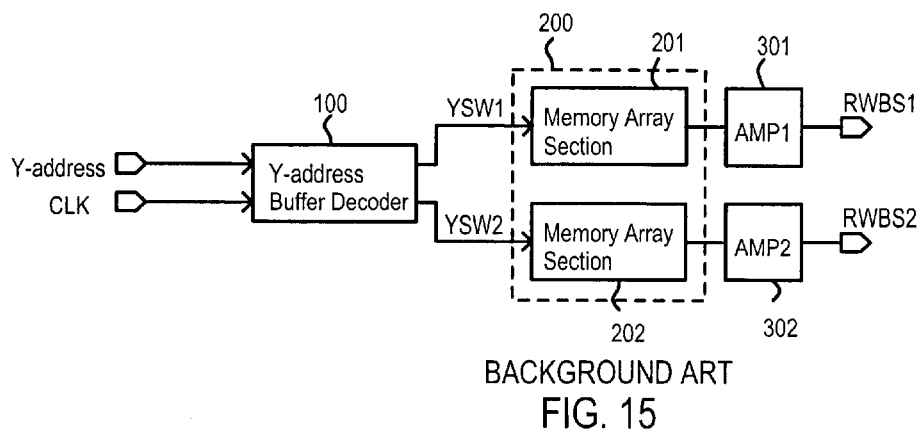
FIG. 15 is a block diagram of a SDRAM with a conventional 2-bit prefetch operation.

Referring now to FIG. 1, a semiconductor memory device according to a first embodiment is set forth in a block schematic diagram. A semiconductor memory device according to a first embodiment can include similar constituents as the conventional case set forth in FIG. 15. To that extent, like constituents will be referred to by the same general reference character with a different subscript as needed.

The semiconductor memory device of FIG. 1 can be a SDRAM constructed to access memory cells in a 2-bit prefetch mode. A SDRAM may include a memory cell array 200 which can be divided into memory cell segments (201 and 202), each containing half of the memory cells of the memory cell array 200. Memory cell segments (201 and 202) can have columns of memory cells that can be accessed by Y-address buffer decoders (100-1 and 100-2) respectively. Y-address buffer decoders (100-1 and 100-2) may receive latch signals (CLK1 and CLK2) respectively. Y-address buffer decoder 100-1 can provide an active column switch line from the group of column switch lines YSW1 synchronously with the latch signal CLK1. A Y-address buffer decoder 100-2 can provide an active column switch line from the group of column switch lines YSW2 synchronously with the latch signal CLK2. Latch signals (CLK1 and CLK2) may be generated at different time intervals by a clock generating circuit 400 as will be discussed later.

Column switch lines (YSW1 and YSW2) can be two groups of column switch lines connected to the memory cell segments (201 and 202) respectively. Memory cell segments (201 and 202) may each contain memory cells that number as an equal half of the number of memory cells in a memory cell array 200. Y-address (column address) signals can be generated external to the SDRAM and applied to the Y-address buffer decoder 100-1 as an input. A Y-address buffer decoder 100-1 can also receive the latch signal CLK1 as an input. A Y-address buffer decoder 100-1 may activate, in synchronism with the latch signal CLK1, a column switch line from the group of column switch lines YSW1 in accordance with the value of the received Y-address signals. A Y-address buffer decoder 100-2 may receive the Y-address signals as an input. A Y-address buffer decoder 100-2 may also receive the latch signal CLK2 as an input. A Y-address buffer decoder 100-2 can activate, in synchronism with the latch signal CLK1, a column switch line from the group of column switch lines YSW2 in accordance with the value of the received Y-address signals.

Column switch lines YSW1 and YSW2 can designate even column switch lines (YSW1) and odd column switch lines (YSW2). Thus, when Y-address buffer decoders (100-1 and 100-2) receive an even Y-address value (Y), a Y-address buffer decoder 100-1 can activate a column switch line, which corresponds to the Y-address value (Y), from the group of column switch lines YSW1. Also, at the same time, a Y-address buffer decoder 100-2 can activate a column switch line, which corresponds to the Y address value (Y+1), from the group of column switch lines YSW2.

However, when Y-address buffer decoders (100-1 and 100-2) receive an odd Y-address value (Y), a Y-address buffer decoder 100-2 can activate a column switch line, which corresponds to the Y-address value (Y), from the group of column switch lines YSW2. Also, at the same time, a Y-address buffer decoder 100-1 can activate a column switch line, which corresponds to the Y address value (Y+1), from the group of column switch lines YSW1.

Thus, a memory cell from both memory cell segments (201 and 202) can be accessed constituting a 2-bit prefetch. The 2 prefetched bits can correspond to bits with consecutive column addresses. In the example shown, memory cell array 200 can divided into two equal halves where each half corresponds to a memory cell segment (201 or 202). Memory cell segment 201 may contain only memory cells that have even column addresses and memory cell segment 202 may contain only memory cells that have odd column addresses.

Additionally, an X-address (row address) buffer decoder (not shown) may be coupled to the memory cell segments (201 and 202) to activate a row of memory cells in each memory cell segment (201 and 202). For example, an X-address signal can be received externally from the SDRAM and used to activate a word line (not shown) in each memory cell segment (201 and 202). Then, based on a Y-address signal (column address) can be received externally from the SDRAM, a column switch line can be selected from each of the groups of column switch lines (YSW1 and YSW2) to access a bit with an even column address from memory cell segment 201 and a bit with an odd column address from memory cell segment 202. These accessed memory cells can have a row address which corresponds to the value of the received X-address signal and column addresses which corresponding to the value of the received Y-address signal (Y) for one bit and (Y+1) for the other bit.

In the 2-bit prefetch operation, the 2 prefetched bits, which may have consecutive column address values, can be accessed on input/output (I/O) buses (RWBS1 and RWBS2) by way of sense amplifiers (301 and 302) synchronously with latch signals (CLK1 and CLK2) respectively. Thereafter, a processor can gain access (read/write) to them on successive external clock CLK cycles.

A clock generating circuit 400 may receive an external clock signal CLK and a reference voltage VREF and generate latch signals (CLK1 and CLK2). A reference voltage VREF may be used as a logic level reference for the external clock CLK. A reference voltage VREF may be provided external to the SDRAM or it may be generated internally using a voltage reference generator, as but two examples. A clock generating circuit 400 may also receive a prefetch clock enable signal PCEN, which can be generated by a control circuit (not shown). A prefetch clock enable signal PCEN can enable the clock generating circuit 400 to generate latch signals (CLK1 and CLK2) when in one logic state and disable the clock generating circuit 400 when in another logic state.

Y-address buffer circuits (100-1 and 100-2) can activate a column switch line from the group of column switch lines (YSW1 and YSW2) respectively. Column switch lines may be activated synchronously with the latch signals (CLK1 and CLK2). Latch signals (CLK1 and CLK2) may be activated at different time intervals. Thus, column switch lines (YSW1 and YSW2) may be activated at different time intervals. The activation timings of latch signals (CLK1 and CLK2) can be determined by using a delay circuit, or by activating one at a one phase of CLK (for example, CLK high) and activating the other at another phase of CLK (for example, CLK low), to name but two examples. However, if the time delay between the latch signals (CLK1 and CLK2) is too large, then CAS (Column Address Strobe) latency can be adversely affected, causing an undue delay in the data access time of the SDRAM. If the semiconductor memory device is an SDR-DRAM, then it is desirable to keep the maximum time interval between the latch signals (CLK1 and CLK2) equal to the period of the external clock signal CLK or less. However, if the semiconductor memory device is a DDR-DRAM, then it is desirable to keep the maximum time interval between the latch signals (CLK1 and CLK2) equal to half the period of the external clock signal CLK or less.

Figure 2:
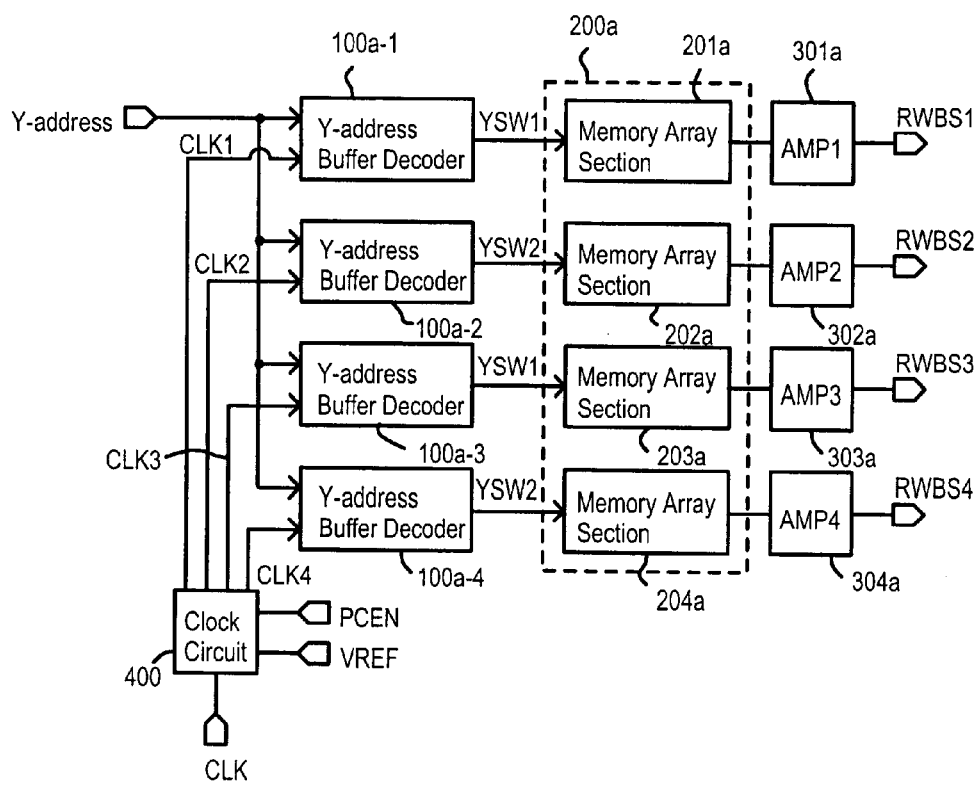
FIG. 2 is a block schematic diagram of a semiconductor memory device according to a second embodiment.

Referring now to FIG. 2, a semiconductor memory device according to a second embodiment is set forth in a block schematic diagram. The semiconductor memory device of FIG. 2 shows a SDRAM constructed to access memory cells in a 4-bit prefetch mode (4-bits are accessed from the memory array in parallel). A SDRAM according to a second embodiment may include a memory cell array 200*a* which is divided into memory cell segments (201*a*–204*a*), each containing one quarter of the memory cells of the memory cell array 200*a*. Memory cell segments (201*a*–204*a*) may have columns of memory cells that can be accessed by a Y-address buffer decoder (100*a*-1–100*a*-4) respectively. Y-address buffer decoders (100*a*-1 and 100*a*-4) may receive latch signal (CLK1–CLK4) respectively. Y-address buffer decoder 100*a*-1 can provide an active column switch line from the group of column switch lines YSW1 synchronously with the latch signal CLK1. A Y-address buffer decoder 100*a*-2 can provide an active column switch line from the group of column switch lines YSW2 synchronously with the latch signal CLK2. A Y-address buffer decoder 100*a*-3 can provide an active column switch line from the group of column switch lines YSW3 synchronously with the latch signal CLK3. A Y-address buffer decoder 100*a*-4 can provide an active column switch line from the group of column switch lines YSW4 synchronously with the latch signal CLK4. Latch signals (CLK1–CLK4) can be generated at different time intervals by a clock generating circuit 400*a*.

According to one approach, memory cell segments (201*a*–204*a*) can be divided into column addresses on a modulo four basis, as will now be explained. Column addresses that are divisible by four with no remainder can be designated to the memory cell segment 201*a*. Column addresses that are divisible by four with a remainder of one can be designated to the memory cell segment 201*b*. Column addresses that are divisible by four with a remainder of two can be designated to yet another memory cell segment 201*c*. Column addresses that are divisible by four with a remainder of three can be designated to yet a different memory cell segment 201*d*.

Additionally, an X-address (row address) buffer decoder (not shown) can be coupled to memory cell segments (201 and 202) to activate a row of memory cells in each memory cell segment (201*a*–204*a*). For example, a X-address signal can be received externally from the SDRAM and used to activate a word line (not shown) in each memory cell segment (201*a*–204*a*). Then, based on Y-address signal (column address) that may be received externally from the SDRAM, a column switch line can be selected from each of the groups of column switch lines (YSW1–YSW4) to access a bit from each of the memory cell segments (201*a*–204*a*). These accessed memory cells can have a row address which corresponds to the value of the received X-address signal and column addresses which correspond to the value of the received Y-address signal (Y) thru (Y+3) consecutively.

In a 4-bit prefetch operation, 4 prefetched bits, which may have consecutive column address values, can be accessed on I/O buses (RWBS1–RWBS4) by way of sense amplifiers (301*a*–304*a*) synchronously with latch signals (CLK1–CLK4) respectively. Thereafter a processor can gain access (read/write) to them on successive external clock CLK cycles.

A clock generating circuit 400a in the example of FIG. 2 may receive an external clock signal CLK and a reference voltage VREF, and generate latch signals (CLK1–CLK4). A reference voltage VREF may be used as a logic level reference for the external clock CLK. A reference voltage VREF may be provided external to the SDRAM or it may be generated internally using a voltage reference generator. The clock generating circuit 400a can also receive a prefetch clock enable signal PCEN which can be generated by a control circuit (not shown). A prefetch clock enable signal PCEN can enable the clock generating circuit 400a to generate latch signals (CLK1–CLK4) when in one logic state and can disable the clock generating circuit 400a when in another logic state.

Y-address buffer circuits (100a-1 to 100a-4) can activate a column switch line from the group of column switch lines (YSW1–YSW4) respectively. Column switch lines can be activated synchronously with the latch signals (CLK1–CLK4). Latch signals (CLK1–CLK4) may also be activated at different time intervals. Thus, column switch lines (YSW1–YSW4) can be activated at different time intervals. The activation timings of latch signals (CLK1–CLK4) can be determined by using a delay circuit or by phase of CLK, or a combination of both techniques to name but a few examples. However, if the time delay between the latch signals (CLK1–CLK4) is too large then CAS (Column Address Strobe) latency can be adversely affected causing an undue delay in the data access time of the SDRAM. If the semiconductor memory device is an SDR-DRAM, then it is desirable to keep the maximum time interval between the latch signals (CLK1–CLK4) equal to the period of the external clock signal CLK or less. However, if the semiconductor memory device is a DDR-DRAM, then it is desirable to keep the maximum time interval between the latch signals (CLK1 and CLK4) equal to half the period of the external clock signal CLK or less.

The operation of the first and second embodiments of FIGS. 1 and 2 will now be described with reference to the timing diagrams of FIGS. 3 to 9.

Figure 3:
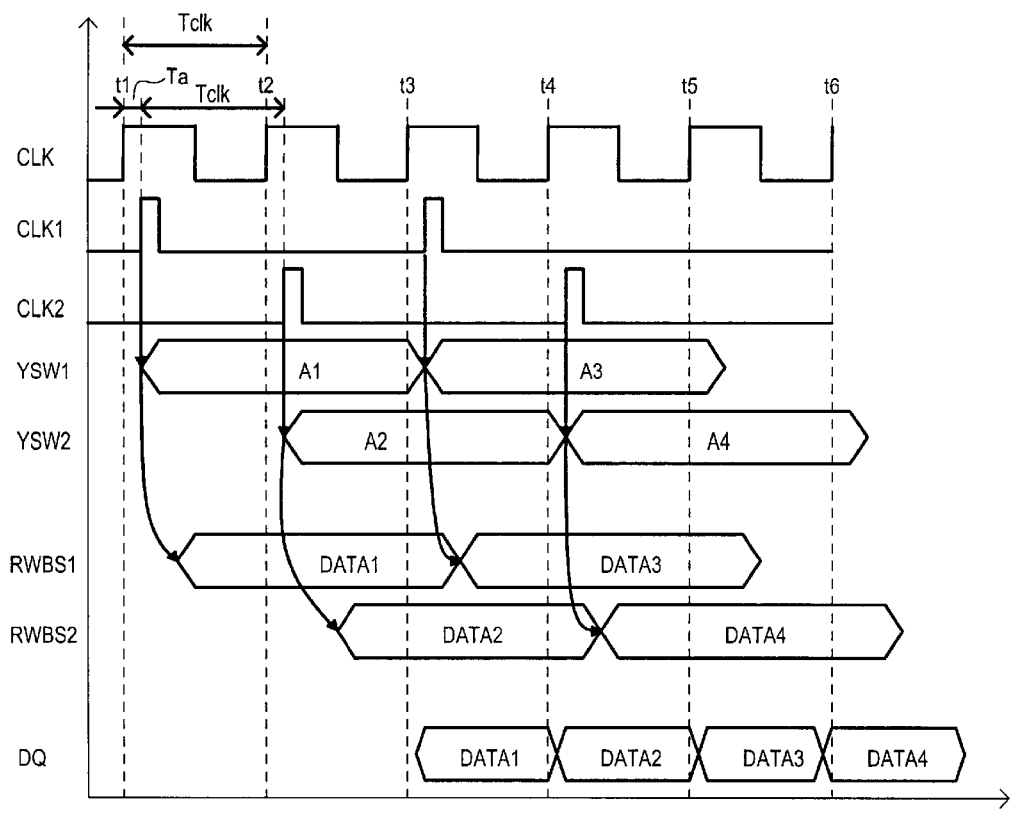
FIG. 3 is a timing diagram illustrating access timings of data read from the memory cells of a SDR-SDRAM as illustrated in the semiconductor memory device of FIG. 1.

FIG. 3 is a timing diagram illustrating access timings of data read from the memory cells of a SDR-SDRAM as illustrated in the semiconductor memory device of FIG. 1. In this example, the time interval between the activation of the latch signals (CLK1 and CLK2) is kept equal to the period of the external clock signal CLK.

In a read operation, control signals, a row address signal (not shown) and column address signal (not shown) are applied externally to the SDRAM synchronously with the clock signal CLK having a period of Tclk. A row address signal can activate a word line in each memory cell segment (201 and 202). The read operation of FIG. 3 is a 4-bit burst read with the beginning bit identified by the externally applied row and column address signals. When data in the form of a burst is written to or read from a SDRAM in a prefetch mode, the address values accessed by the column switch lines (YSW1 and YSW2) will differ depending whether a sequential or interleaved count mode is used. A particular count mode can be designated by an external control signal(s) and the externally applied column address, as but one example. For simplicity, it is assumed that the SDRAM is operating in the sequential count mode and that the least significant bit of the externally applied column address is a zero. The accessed column addresses A1–A4 may thus be sequential addresses with one bit increment between each.

Given the above conditions address A1 is an even number. Thus, at a time delay Ta following t1, the first latch signal CLK1 in the form of a pulse can be generated and a column switch line from the group of column switch lines YSW1 which correspond to address A1 can be activated. DATA1 from memory cell segment 201 can be output to I/O bus RWBS1 after a circuit propagation delay. Then, after a clock period Tclk of the external clock CLK, the latch signal CLK2 in the form of a pulse can be generated and a column switch line from the group of column switch lines YSW2, which corresponds to address A2 =(A1+1) can be activated. DATA2 from memory cell segment 202 can thus be output to I/O bus RWBS2 after a circuit propagation delay. After another clock period Tclk of the external clock CLK or a time delay Ta following t3, the latch signal CLK1 in the form of a pulse can be again generated. A column switch line from the group of column switch lines YSW1 which corresponds to address A3=(A1+2) can thus be activated. DATA3 from memory cell segment 201 can thus be output to I/O bus RWBS1 after a circuit propagation delay. After yet another clock period Tclk of the external clock CLK or a time delay Ta following t4, the latch signal CLK2 in the form of a pulse may again be generated. A column switch line from the group of column switch lines YSW2 which corresponds to address A4=(A1+3) can thus be activated. DATA4 from memory cell segment 202 can thus be output to I/O bus RWBS2 after a circuit propagation delay. It is noted that the activation of a column switch line from the group of column switch lines YSW1 may occur synchronously with the latch signal CLK1, thus the data can be output to I/O bus RWBS1 synchronously with the latch signal CLK1. Also, the activation of a column switch line from the group of column switch lines YSW2 can occur synchronously with the latch signal CLK2, thus the data can be output to I/O bus RWBS2 synchronously with the latch signal CLK2. The data on the I/O buses RWBS1 and RWBS2 (first DATA1 and DATA2 and then DATA3 and DATA4) can be alternately latched at a predetermined timing synchronously with the clock signal CLK, and then sequentially output externally as data signals DQ synchronously with and on sequential CLK cycles.

The change of the activation of the column switch lines YSW1 and YSW2 (from A1 to A3 or from A2 to A4) during the burst cycle can be performed synchronously with the external clock signal CLK by circuitry within the Y-address buffer decoders (100-1 and 100-2) and controlled by a control circuit on the SDRAM (not shown).

Figure 16A:
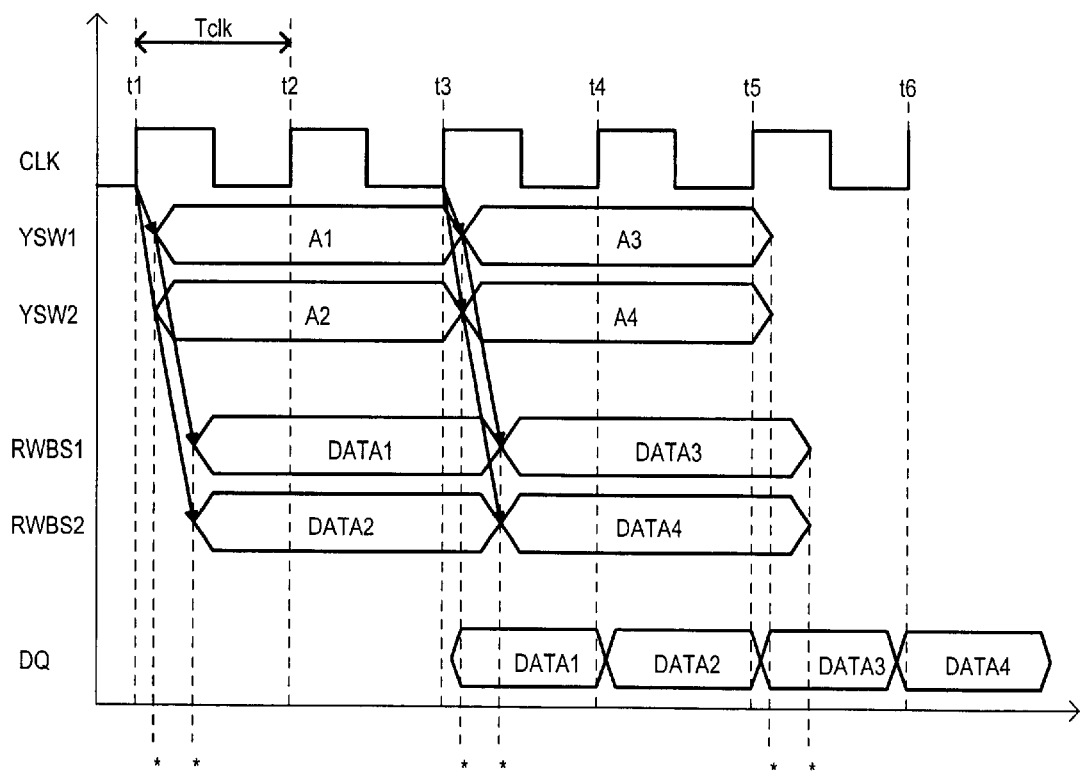
FIGS. 16(a) and (b) are timing diagrams each illustrating access timing of data read from the memory cells of a SDR-SDRAM as illustrated in the semiconductor memory device of FIG. 15.
Figure 16B:
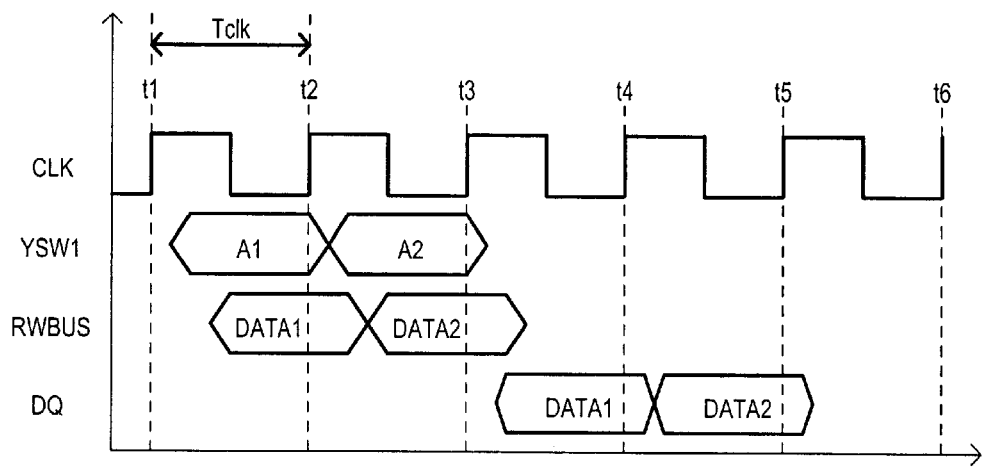
Figure 17:
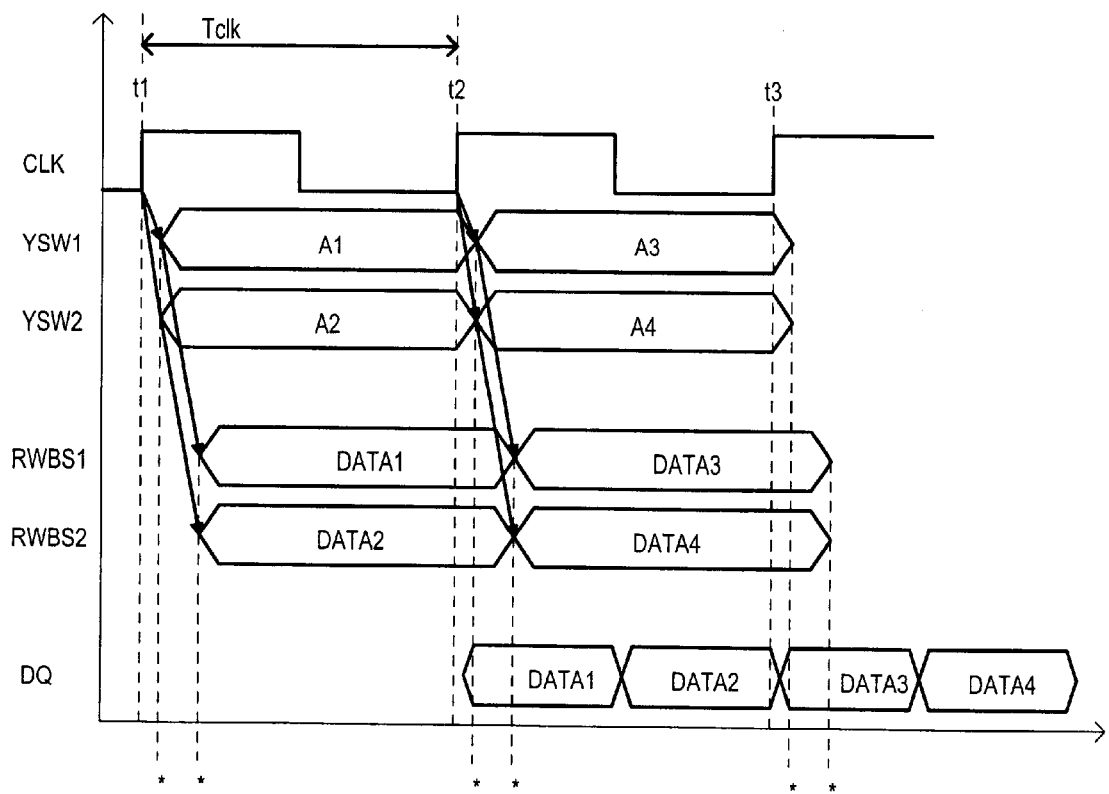
FIG. 17 is a timing diagram illustrating access timings of data read from the memory cells of a DDR-SDRAM as illustrated in the semiconductor memory device of FIG. 15.

It is noted that by staggering the generation of the latch signals (CLK1 and CLK2) as shown in FIG. 3, the switching of the column switch lines (YSW1 and YSW2) and the changing of the data on the I/O buses (RWBS1 and RWBS2) occurs at different time intervals. This can reduce the magnitude of internal current spikes on the SDRAM and thus reduce noise. This is in contrast to the conventional example shown in FIG. 16 in which the switching of column switch lines and changing of data on the I/O buses occurred at substantially the same time interval.

Figure 4:
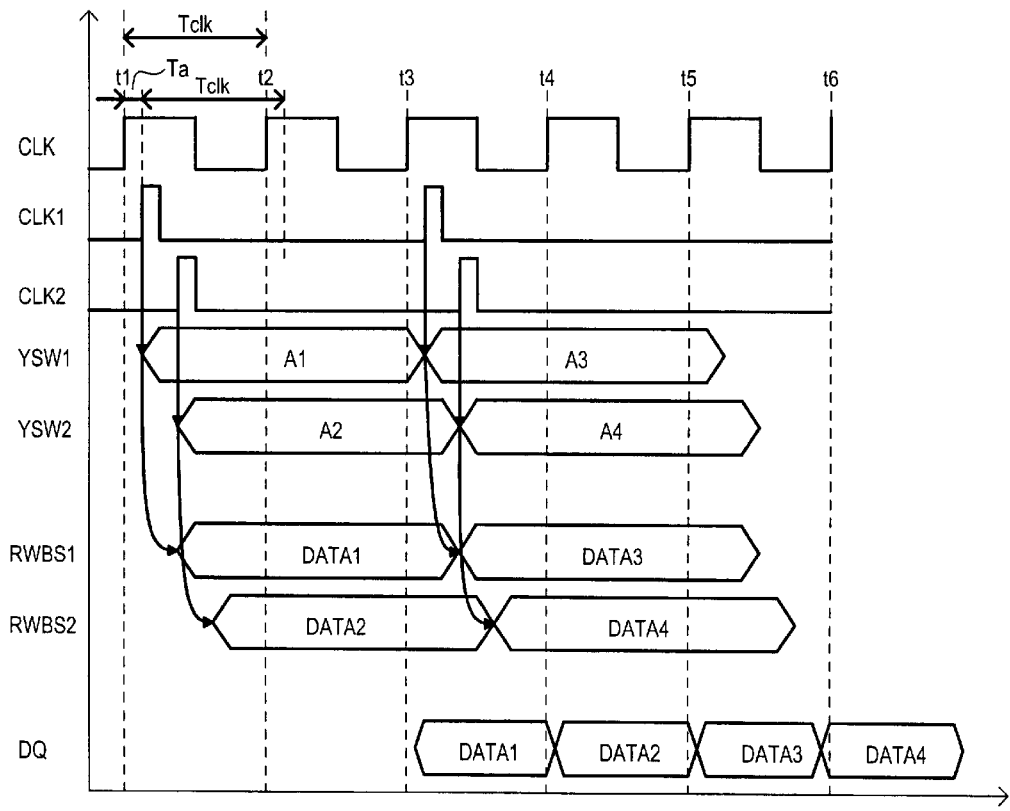
FIGS. 4 is another timing diagram illustrating access timings of data read from the memory cells of a SDR-SDRAM as illustrated in the semiconductor memory device of FIG.

FIG. 4 is a another timing diagram illustrating access timings of data read from the memory cells of a SDR-SDRAM as illustrated in the semiconductor memory device of FIG. 1. In this example, the time interval between the activation of the latch signals (CLK1 and CLK2) is kept equal to a predetermined time delay Tb. The external operating conditions can be the same as in the example set forth in the timing diagram of FIG. 3. In the example of FIG. 4, the latch signal CLK1 is generated after a time delay Ta following time t1 and the latch signal CLK2 is generated a time delay Tb after the generation of the latch signal CLK1.

Likewise, the latch signal CLK1 is regenerated after a time delay Ta following time t3 and the latch signal CLK2 is regenerated a time delay Tb after the regeneration of the latch signal CLK1.

Column switch lines (YSW1 and YSW2) can be activated and data may be delivered to the I/O buses (RWBS1 and RWBS2) in a similar manner with respect to the latch signals (CLK1 and CLK2) as in the example set forth in the timing diagram of FIG. 3. By staggering the generation of the latch signals (CLK1 and CLK2) as shown in FIG. 4, the switching of the column switch lines (YSW1 and YSW2) and the changing of the data on the I/O buses (RWBS1 and RWBS2) occurs at different time intervals. This may reduce the magnitude of internal current spikes on the SDRAM and thus reduce noise. This is in contrast to the conventional example shown in FIG. 16 in which the switching of column switch lines and changing of data on the I/O buses occurred at substantially the same time interval.

Figure 5:
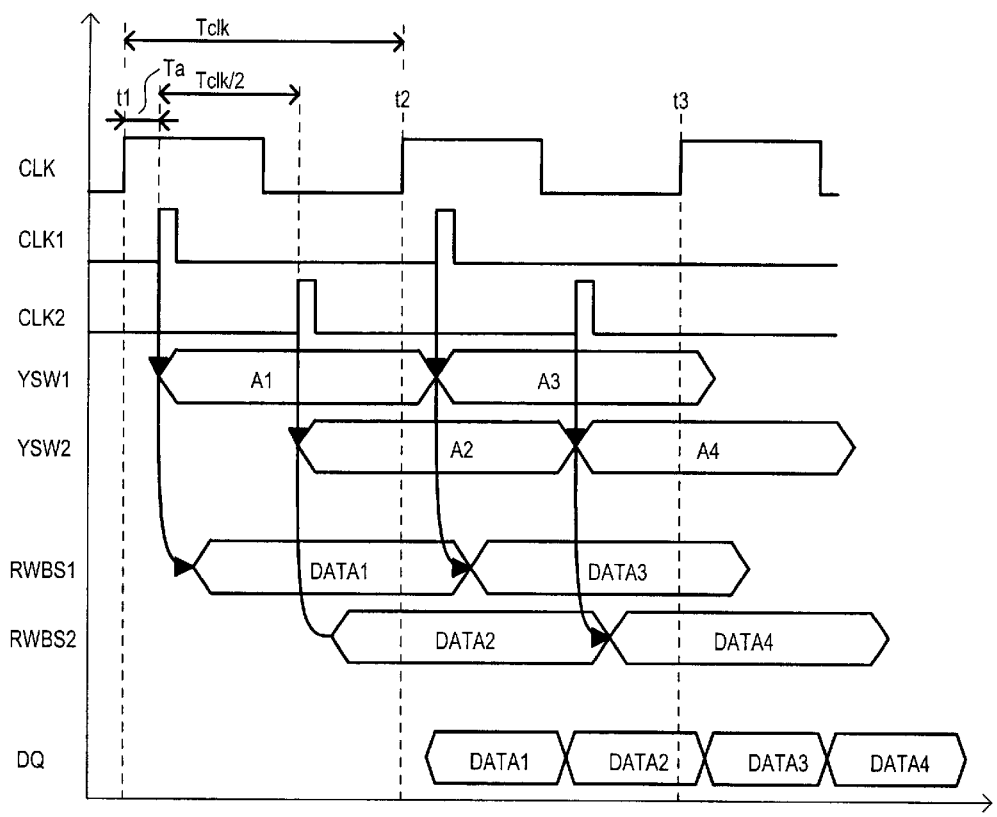
FIG. 5 is a timing diagram illustrating access timings of data read from the memory cells of a DDR-S DRAM as illustrated in the semiconductor memory device of FIG. 1.

FIG. 5 is a timing diagram illustrating access timings of data read from the memory cells of a DDR-SDRAM as illustrated in the semiconductor memory device of FIG. 1. In this example, the time interval between the activation of the latch signals (CLK1 and CLK2) is kept equal to half the period of the external clock signal CLK. In the read operation of FIG. 5, external signals can be applied to the SDRAM synchronously with the both the rising and falling edges of the external clock signal CLK having a period of Tclk. Column switch lines (YSW1 and YSW2) and the data on the I/O buses (RWBS1 and RWBS2) can change with a time interval equal to the period (Tclk) of the external clock CLK, but the output data signals DQ can change with a time interval equal to one-half the period (Tclk/2) of the external clock CLK. However, the sequence of the column switch lines (YSW1 and YSW2) and the I/O buses (RWBS1 and RWBS2) can be the same as the examples given in the timing diagrams of FIGS. 3 and 4. In the timing diagram of FIG. 5, a time delay Ta following t1, the first latch signal CLK1 in the form of a pulse can be generated and a column switch line from the group of column switch lines YSW1, which corresponds to address A1, can be activated. DATA1 from memory cell segment 201 may thus be output to I/O bus RWBS1 after a circuit propagation delay. Then, after a half clock period Tclk/2 of the external clock CLK, the latch signal CLK2 in the form of a pulse can be generated and a column switch line from the group of column switch lines YSW2, which corresponds to address A2=(A1+1) can be activated. DATA2 from memory cell segment 202 may thus be output to I/O bus RWBS2 after a circuit propagation delay. After another half clock period Tclk/2 of the external clock CLK or a time delay Ta following t2, the latch signal CLK1 in the form of a pulse may again be generated, and a column switch line from the group of column switch lines YSW1 which corresponds to address A3=(A1+2) can be activated. DATA3 from memory cell segment 201 may thus be output to I/O bus RWBS1 after a circuit propagation delay. After yet another half clock period Tclk of the external clock CLK, the latch signal CLK2 in the form of a pulse may again be generated and a column switch line from the group of column switch lines YSW2 which corresponds to address A4=(A1+3) can be activated. DATA4 from memory cell segment 202 may thus be output to I/O bus RWBS2 after a circuit propagation delay. It is noted that the activation of a column switch line from the group of column switch lines YSW1 may occur synchronously with the latch signal CLK1, thus the data can be output to I/O bus RWBS1 synchronously with the latch signal CLK1. Also, the activation of a column switch line from the group of column switch lines YSW2 may occur synchronously with the latch signal CLK2, thus the data can be output to I/O bus RWBS2 synchronously with the latch signal CLK2. The data on the I/O buses RWBS1 and RWBS2 (first DATA1 and DATA2 and then DATA3 and DATA4) may be alternately latched at a predetermined timing synchronously with the rising and falling edges of clock signal CLK, and then sequentially output externally as data signals DQ synchronously with and on sequential CLK rising and falling edges.

It is noted that by staggering the generation of the latch signals (CLK1 and CLK2) as shown in FIG. 5, the switching of the column switch lines (YSW1 and YSW2) and the changing of the data on the I/O buses (RWBS1 and RWBS2) occurs at different time intervals. This can reduce the magnitude of internal current spikes on the SDRAM and thus reduce noise. This is in contrast to the conventional example shown in FIG. 16 in which the switching of column switch lines and changing of data on the I/O buses occurred at substantially the same time interval.

Figure 6:
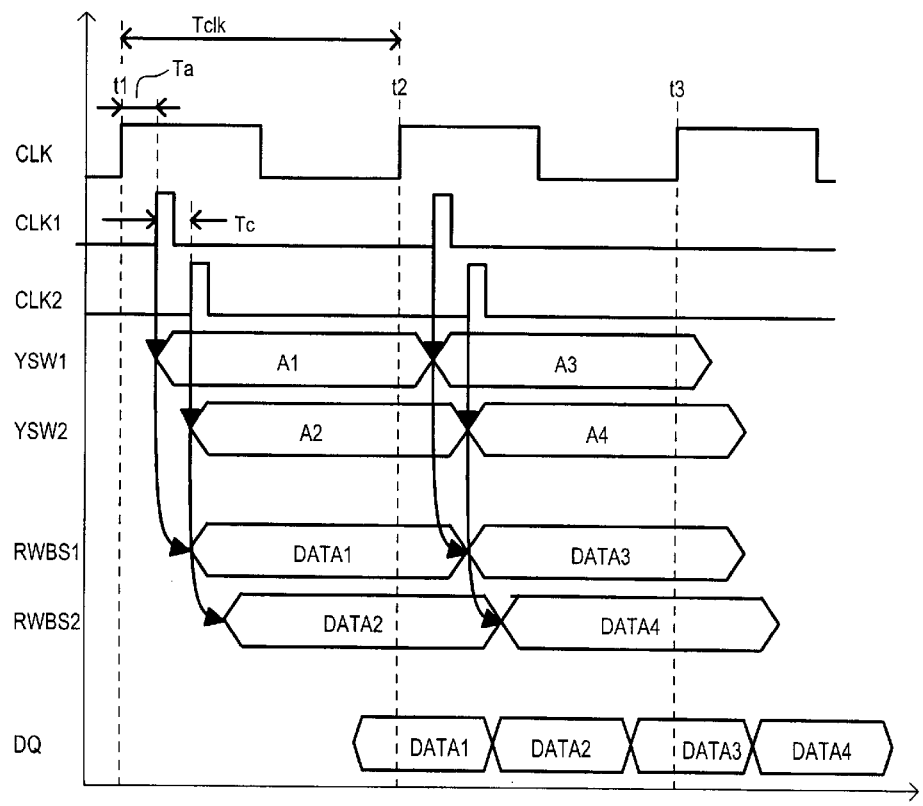
FIG. 6 is yet another timing diagram illustrating access timings of data read from the memory cells of a DDR-S DRAM as illustrated in the semiconductor memory device of FIG. 1.

FIG. 6 is yet another timing diagram illustrating access timings of data read from the memory cells of a DDR-SDRAM as illustrated in the semiconductor memory device of FIG. 1. In this example, the time interval between the activation of the latch signals (CLK1 and CLK2) can be kept equal to a predetermined time delay of Tc. In the read operation of FIG. 6, external signals may be applied to the SDRAM synchronously with the both the rising and falling edges of the external clock signal CLK having a period of Tclk. Column switch lines (YSW1 and YSW2) and the data on the I/O buses (RWBS1 and RWBS2) can change with a time interval equal to the period (Tclk) of the external clock CLK, but the output data signals DQ can change with a time interval equal to one-half the period (Tclk/2) of the external clock CLK. However, the sequence of the column switch lines (YSW1 and YSW2) and the I/O buses (RWBS1 and RWBS2) may be the same as the examples given in the timing diagrams of FIG. 5. In the timing diagram of FIG. 6, a time delay Ta following t1 the latch signal CLK1 in the form of a pulse can be generated. Then, after a predetermined time delay of Tc after the generation of the latch signal CLK1, the latch signal CLK2 in the form of a pulse can be generated. Then, a time delay Ta following t2, the latch signal CLK1 in the form of a pulse can be regenerated. After yet another predetermined time delay of Tc after the regeneration of the latch signal CLK1, the latch signal CLK2 in the form of a pulse can be regenerated. In FIG. 6, the activation of the column switch lines (YSW1 and YSW2) and the I/O buses (RWBS1 and RWBS2) may operate synchronously with the latch signals (CLK1 and CLK2) as in the timing diagram of FIG. 4.

It is noted that by staggering the generation of the latch signals (CLK1 and CLK2) as shown in FIG. 6, the switching of the column switch lines (YSW1 and YSW2) and the changing of the data on the I/O buses (RWBS1 and RWBS2) occurs at different time intervals. This can reduce the magnitude of internal current spikes on the SDRAM and thus reduce noise. This is in contrast to the conventional example shown in FIG. 16, in which the switching of column switch lines and changing of data on the I/O buses occurred at substantially the same time interval.

Figure 7:
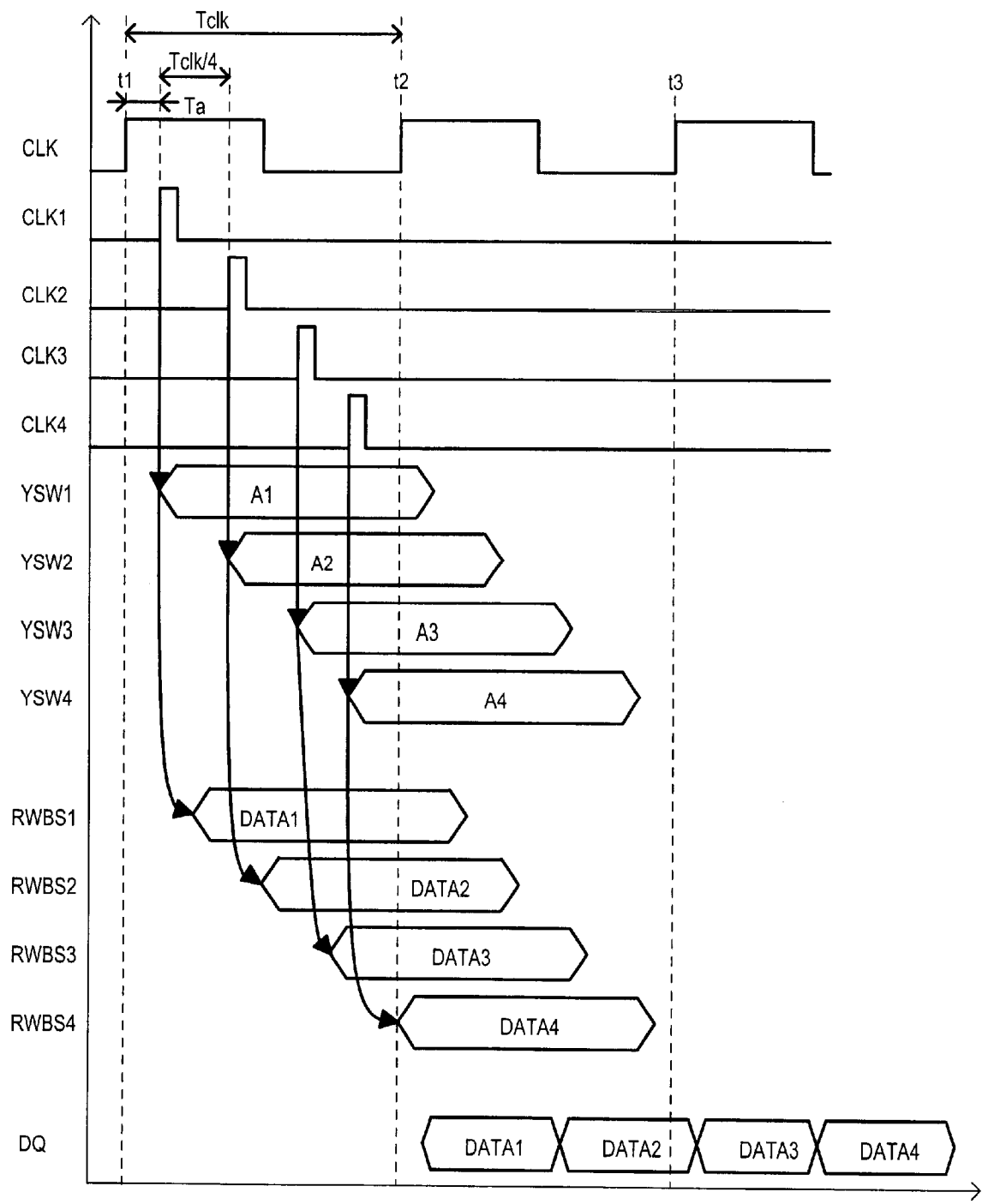
FIG. 7 is a timing diagram illustrating access timings of data read from the memory cells of a DDR-SDRAM as illustrated in the semiconductor memory device of FIG. 2.

FIG. 7 is a timing diagram illustrating access timings of data read from the memory cells of a DDR-SDRAM as illustrated in the semiconductor memory device of FIG. 2. In this example, the time interval between the activation of the latch signals (CLK1–CLK4) is kept equal to the one-fourth the period of the external clock signal CLK or Tclk/4.

In a read operation according to FIG. 7, control signals, a row address signal (not shown) and column address signal (not shown) can be applied externally to the SDRAM synchronously with the clock signal CLK having a period of Tclk. A row address signal can activate a word line in each memory cell segment (201a–204a). In FIG. 7, the read operation is a 4-bit burst read with the beginning bit identified by the externally applied row and column address signals. When data in the form of a burst is written to or read from a SDRAM in a prefetch mode, the address values accessed by the column switch lines (YSW1–YSW4) can differ depending whether a sequential or interleaved count mode is used. A particular count mode may be designated by an external control signal(s) and the externally applied column address as but one example. For simplicity, it is assumed that the SDRAM is operating in the sequential count mode and that the least significant bit of the externally applied column address is a zero. Consequently, the accessed column addresses A1–A4 can be sequential addresses with one bit increment between each.

Given the above conditions, the beginning burst address A1 (which is zero) is divisible by four with a remainder of zero. Thus, at a time delay Ta following t1, the latch signal CLK1 in the form of a pulse can be generated and a column switch line from the group of column switch lines YSW1, which corresponds to address A1, can be activated. DATA1 from memory cell segment 201a may thus be output to I/O bus RWBS1 after a circuit propagation delay. Then, after one-fourth clock period Tclk/4 of the external clock CLK, the latch signal CLK2 in the form of a pulse can be generated and a column switch line from the group of column switch lines YSW2, which corresponds to address A2=(A1+1), can be activated. DATA2 from memory cell segment 202a may thus be output to I/O bus RWBS2 after a circuit propagation delay. After another one-fourth clock period Tclk/4 of the external clock CLK or a time delay Ta following the falling edge of the external clock CLK, the latch signal CLK3 in the form of a pulse can be generated and a column switch line from the group of column switch lines YSW3, which corresponds to address A3=(A1+2), can be activated. DATA3 from memory cell segment 201c can thus be output to I/O bus RWBS3 after a circuit propagation delay. After yet another one-fourth clock period Tclk/4 of the external clock CLK, the latch signal CLK4 in the form of a pulse can again be generated and a column switch line from the group of column switch lines YSW4, which corresponds to address A4=(A1+3), can be activated. DATA4 from memory cell segment 202d can thus be output to I/O bus RWBS4 after a circuit propagation delay.

It is noted that the activation of a column switch line from the group of column switch lines YSW1 may occur synchronously with the latch signal CLK1, thus the data may be output to I/O bus-RWBS1 synchronously with the latch signal CLK1. The activation of a column switch line from the group of column switch lines YSW2 may occur synchronously with the latch signal CLK2, thus the data may be output to I/O bus RWBS2 synchronously with the latch signal CLK2. The activation of a column switch line from the group of column switch lines YSW3 may occur synchronously with the latch signal CLK3, thus the data may be output to I/O bus RWBS3 synchronously with the latch signal CLK3. The activation of a column switch line from the group of column switch lines YSW4 may occur synchronously with the latch signal CLK4, thus the data may be output to I/O bus RWBS4 synchronously with the latch signal CLK4.

The data on the I/O buses RWBS1–RWBS4 (DATA1–DATA4) may be alternately latched at a predetermined timing synchronously with the rising and falling edges of clock signal CLK, and then sequentially output externally as data signals DQ synchronously with and on sequential CLK rising and falling edges.

It is noted that by staggering the generation of the latch signals (CLK1–CLK4) as shown in FIG. 7, the switching of the column switch lines (YSW1–YSW4) and the changing of the data on the I/O buses (RWBS1–RWBS4) occurs at different time intervals. This can reduce the magnitude of internal current spikes on the SDRAM and thus reduce noise. This is in contrast to the conventional example shown in FIG. 16 in which the switching of column switch lines and changing of data on the I/O buses occur at substantially the same time interval.

Figure 8:
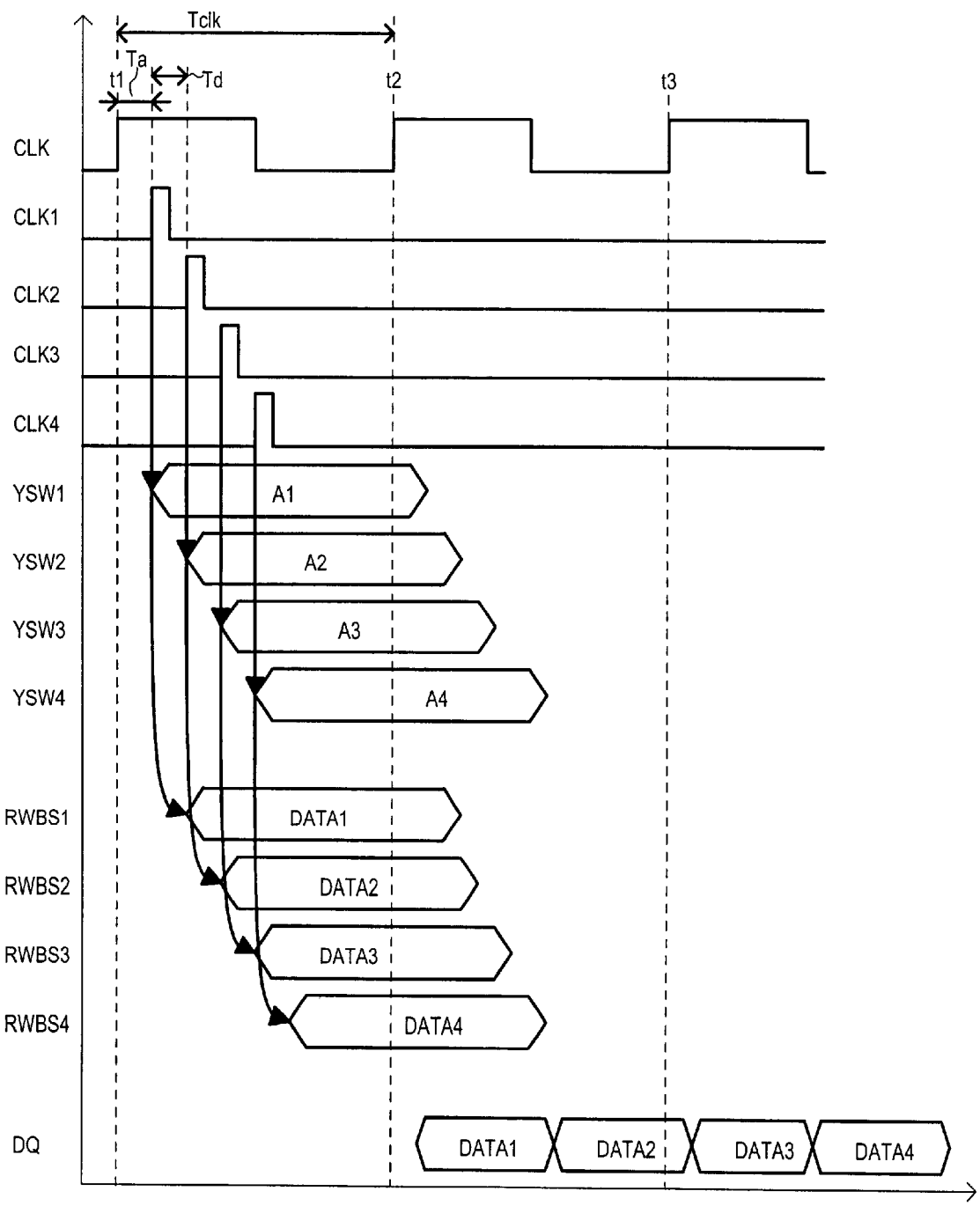
FIG. 8 is yet another timing diagram illustrating access timings of data read from the memory cells of a DDR-SDRAM as illustrated in the semiconductor memory device of FIG. 2.

FIG. 8 is yet another timing diagram illustrating access timings of data read from the memory cells of a DDR-SDRAM as illustrated in the semiconductor memory device of FIG. 2. In this example, the time interval between the activation of the latch signals (CLK1–CLK4) is kept equal to a predetermined time delay of Td. Column switch lines (YSW1–YSW4) and the data on the I/O buses (RWBS1–RWBS4) can be sequentially activated with a time interval equal to the predetermined time delay of Td, but the output data signals DQ can change with a time interval equal to one-half the period (Tclk/2) of the external clock CLK. However, the sequence of the column switch lines (YSW1–YSW4) and the I/O buses (RWBS1–RWBS4) may be the same as the examples given in the timing diagrams of FIG. 7. In the timing diagram of FIG. 8 a time delay Ta following t1, the latch signal CLK1 in the form of a pulse can be generated. Then, after a predetermined time delay of Td after the generation of the latch signal CLK1, the latch signal CLK2 in the form of a pulse can be generated. Then, the predetermined time delay Td following the latch signal CLK2, the latch signal CLK3 in the form of a pulse can be generated. After yet another predetermined time delay of Td after the regeneration of the latch signal CLK3, the latch signal CLK4 in the form of a pulse can be generated. In FIG. 8, the activation of the column switch lines (YSW1–YSW4) and the I/O buses (RWBS1–RWBS4) may operate synchronously with the latch signals (CLK1–CLK4) as in the timing diagram of FIG. 7.

It is noted that by staggering the generation of the latch signals (CLK1–CLK4) as shown in FIG. 8, the switching of the column switch lines (YSW1–YSW4) and the changing of the data on the I/O buses (RWBS1–RWBS4) may occur at different time intervals.

Figure 9:
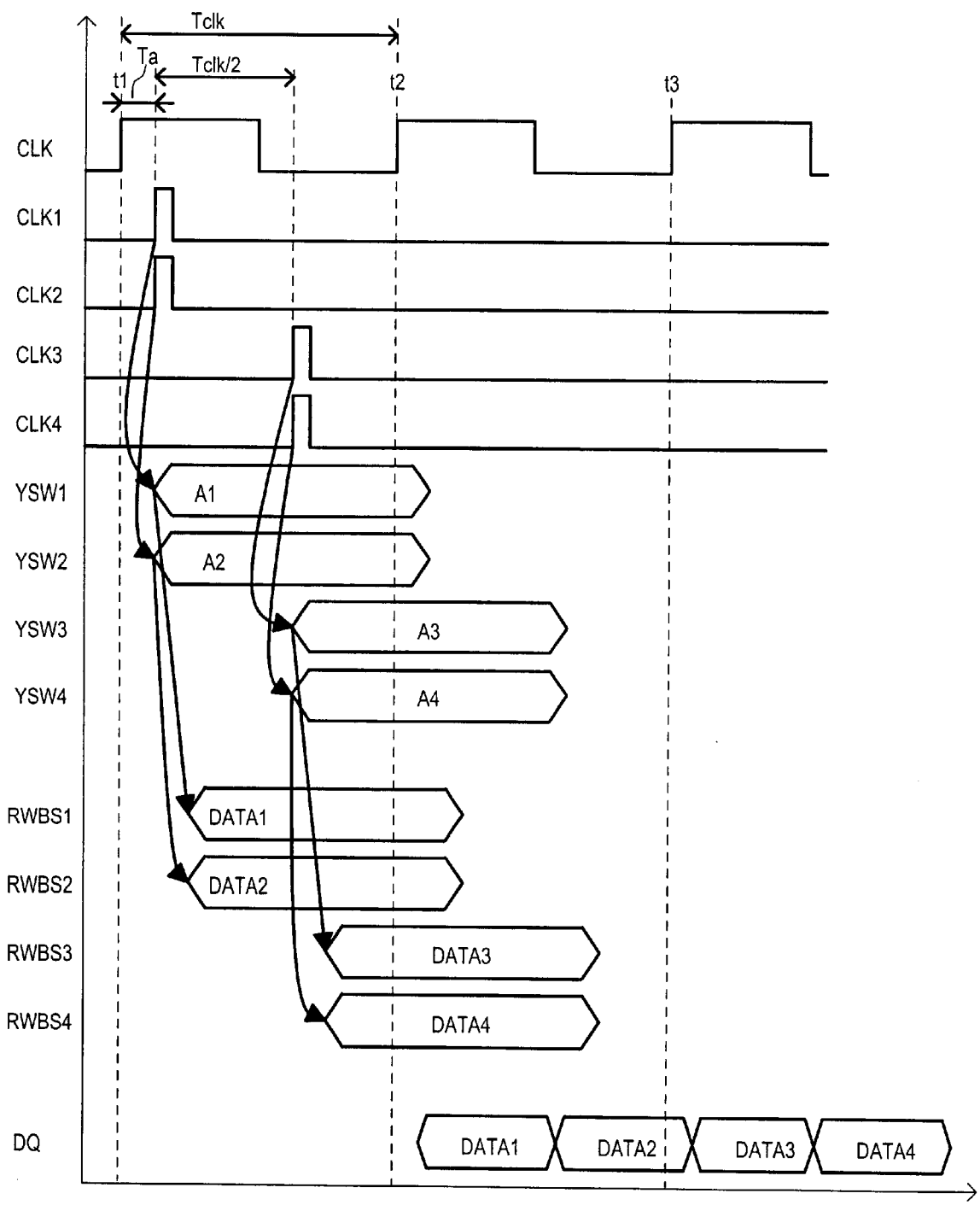
FIG. 9 is yet another timing diagram illustrating access timings of data read from the memory cells of a DDR-SDRAM as illustrated in the semiconductor memory device of FIG. 2.

FIG. 9 is yet another timing diagram illustrating access timings of data read from the memory cells of a DDR-SDRAM as illustrated in the semiconductor memory device of FIG. 2. In this example, the latch signals (CLK1 and CLK2) can be generated at the same time. After a predetermined time interval, the latch signals (CLK3 and CLK4) can be generated at the same time. The time interval between the generation of the latch signals (CLK1 and CLK2) and the latch signals (CLK3 and CLK4) can be one-half the external clock CLK period Tclk/2.

In the timing diagram of FIG. 9, a time delay Ta following ti the latch signals (CLK1 and CLK2), each in the form of a pulse, can be generated. Then, after a predetermined time interval of Tclk/2 after the generation of the latch signals (CLK1 and CLK2), the latch signals (CLK3 and CLK4), each in the form of a pulse, can be generated. In FIG. 9, the activation of the column switch lines (YSW1–YSW4) and the I/O buses (RWBS1–RWBS4) may operate synchronously with the latch signals (CLK1–CLK4), as in the timing diagram of FIG. 8. However, in the timing diagram of FIG. 9, the column switch lines (YSW1 and YSW2) change at substantially the same time and the column switch lines (YSW3 and YSW4) change at substantially the same time.

It is noted that by staggering the generation of the latch signals (CLK1 and CLK2) with respect to the latch signals (CLK3 and CLK4) as shown in FIG. 9, the switching of the column switch lines (YSW1 and YSW2) and the changing of the data on the I/O buses (RWBS1 and RWBS2) occurs at different time intervals with respect to column switch lines (YSW3 and YSW4) and I/O buses (RWBS3 and RWBS4). Thus, a current spike could only be half as large as a conventional 4-bit prefetch in which the column switch lines and I/O buses were changed simultaneously for the 4 prefetched bits.

The structure and operation of a clock generating circuit such as that shown as item 400 in FIG. 1 will now be described with reference to FIGS. 10 to 14.

Figure 10:
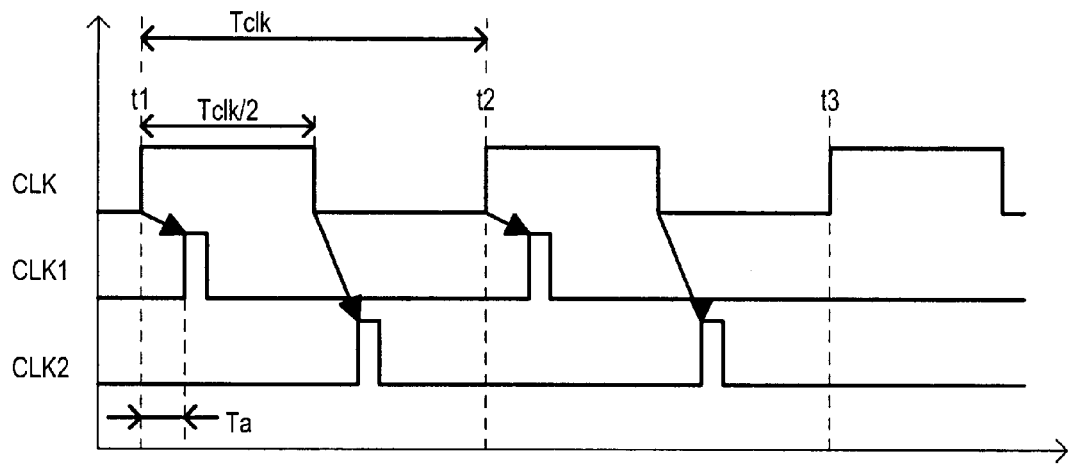
FIG. 10 is a timing diagram illustrating the operation of a clock generating circuit according to one embodiment.
Figure 11:
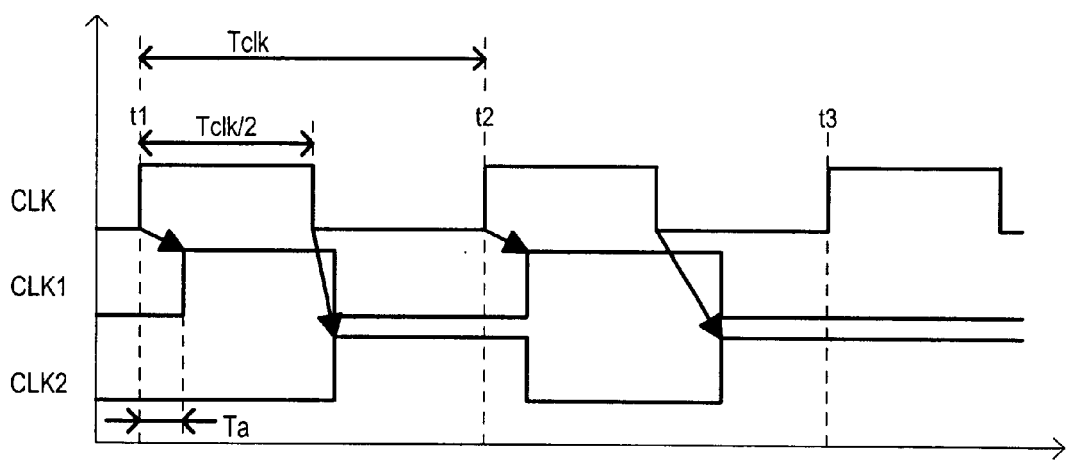
FIG. 11 is another timing diagram illustrating another operation of the clock generating circuit according to one embodiment.

FIGS. 10 and 11 are timing diagrams which illustrate the timings of latch signals (CLK1 and CLK2) with respect to an external clock signal CLK. The timing diagrams of FIGS. 10 and 11 correspond with the DDR-SDRAM timing diagram illustrated in FIG. 5 in which the interval between latch signals (CLK1 and CLK2) can be equal to Tclk/2. In FIG. 10, the latch signals (CLK1 and CLK2) are pulses, having a predetermined width, generated synchronously with the rising a falling edges respectively of the external clock signal CLK.

In FIG. 11, the latch signals (CLK1 and CLK2) can be generated directly from the external CLK signal by way of a buffer with a propagation delay of Ta. Thus, the latch signals (CLK1 and CLK2) can have the same width as the external clock signal CLK. The latch signal CLK2 is inverted with respect to CLK1.

Figure 12:
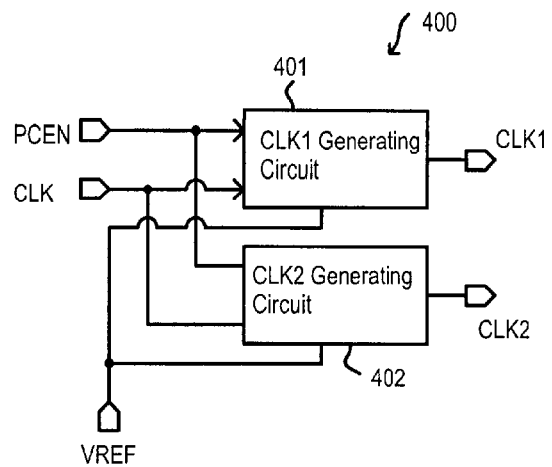
FIG. 12 is a block diagram of a clock generating circuit, which generates latch signals (CLK1 and CLK2), generated with a time interval of Tclk/2 as illustrated in FIG. 10.

Referring now to FIG. 12, a clock generating circuit 400 that can generate latch signals (CLK1 and CLK2), with a time interval of Tclk/2, as illustrated in FIG. 10, is set forth in a block schematic diagram. The clock generating circuit 400 of FIG. 12 may include a CLK1 generating circuit 401 and a CLK2 generating circuit 402. The CLK1 generating circuit 401 can receive the external clock signal CLK and a voltage reference VREF and generate a latch signal CLK1. A latch signal CLK1 can be a pulse generated synchronously with the rising edge of the external CLK signal after a delay of Ta. A CLK2 generating circuit 402 can receive the external clock signal CLK and a voltage reference VREF and generate a latch signal CLK2. A latch signal CLK2 can be a pulse generated synchronously with the falling edge of the external CLK signal after a delay of Ta. A reference voltage VREF can be used as a logic level reference for the external clock CLK. A reference voltage VREF may be provided external to the SDRAM or it may be generated internally using a voltage reference generator, as but two examples.

The CLK1 generating circuit 401 and CLK2 generating circuit 402 can each receive a prefetch clock enable signal PCEN which can be generated by a control circuit (not shown). In this example, each CLK1 and CLK2 generating circuit (401 and 402) can receive a separate prefetch clock enable signal PCEN. As one example, viewing FIG. 3 in conjunction with FIG. 12, the prefetch clock enable signal PCEN for the CLK1 generating circuit 401 could be in an enable state at times t1 and t3 (allowing the generation of CLK 1), but could be in a disable state at times t2 and t4 (suppressing the generation of CLK1). However, the prefetch clock enable signal PCN for the CLK2 generating circuit 402 could be in an enable state at times t2 and t4 (allowing the generation of CLK2), but could be in a disable state at times t1 and t3 (suppressing the generation of CLK2).

Figure 13:
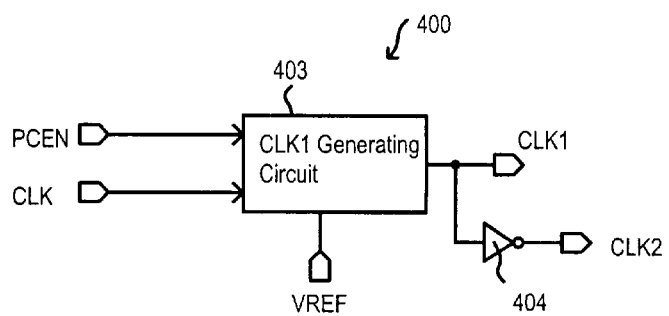
FIG. 13 is a block diagram of a clock generating circuit, which generates latch signals (CLK1 and CLK2), having an inverted relation to each other as illustrated in FIG. 11.

Referring now to FIG. 13, a clock generating circuit 400 which can generate latch signals (CLK1 and CLK2) having an inverted relation to each other as illustrated in FIG. 11, is set forth in a block schematic diagram. The clock generating circuit 400 of FIG. 13 may include a CLK1 generating circuit 403 and an inverter 404. The CLK1 generating circuit 403 can receive an external clock signal CLK and a voltage reference VREF and generate a latch signal CLK1. The latch signal CLK1 can be generated synchronously with the external CLK signal after a delay of Ta. Inverter 404 can receive the latch signal CLK1 as an input and generates the latch signal CLK2. In this way, CLK2 can be a logical inversion of the latch signal CLK1. The CLK1 generating circuit 403 may also receive a prefetch clock enable signal PCEN which can be generated by a control circuit (not shown).

Figure 14:
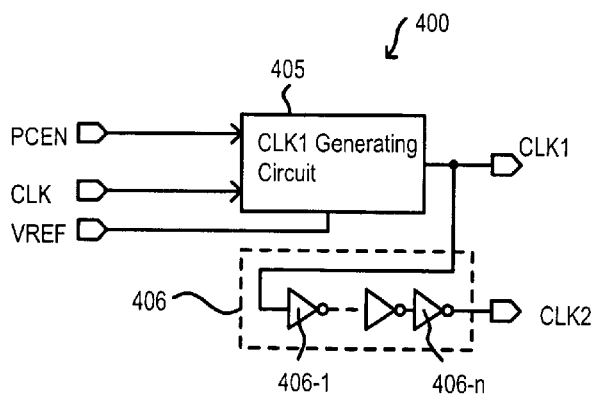
FIG. 14 is a block diagram of a clock generating circuit, which generates latch signals (CLK1 and CLK2), having a specific time interval between each other as illustrated in FIG. 4.

Referring now to FIG. 14, a clock generating circuit 400 which can generate latch signals (CLK1 and CLK2) having a specific time interval between each other as illustrated in FIG. 4, is set forth in a block schematic diagram. The clock generating circuit 400 of FIG. 14 may include a CLK1 generating circuit 405 and a delay circuit 406. The CLK1 generating circuit 405 can receive an external clock signal CLK and a voltage reference VREF, and generate a latch signal CLK1. The latch signal CLK1 can be a pulse generated synchronously with the rising edge of the external CLK signal after a delay of Ta. Delay circuit 406 receives the latch signal CLK1 as an input and generates a latch signal CLK2 as a delayed output. The time interval between the generation of the latch signal CLK1 and the generation of the latch signal CLK2 is determined by the signal propagation time of the delay circuit 406. The delay circuit may include a plurality of inverters (406-1 to 406-n), where n is an even integer, as but one example. The delay time may be adjusted by varying the number of inverters or by using capacitive loads and/or resistive elements in tile inverter string.

The delay time Ta, as discussed with the generation of the latch signals CLK1 and/or CLK2 can be determined by the propagation delay of the CLK1 and/or CLK2 generating circuits (401–403 and 405). Other factors in determining the value of Ta may include column address set-up and hold times and also propagation delays for the external column address through input buffers up to the Y-address buffer decoders (100-1 and 100-2).

As described above, according to the embodiments of this invention, a semiconductor memory device such as a SDRAM operating in a multi-bit prefetch mode, the switching of signal lines and/or activation of circuitry associated with Y-address signals, such as Y-address buffer decoders (100-1 and 100-2) and internal I/O buses (RWBS1 and RWBS2), can be staggered so as to reduce on-chip noise as compared to a memory device operating in a conventional prefetch mode.

As described above, according to the present invention, a semiconductor memory device, such as an SDRAM operating in a multi-bit prefetch mode, may include a plurality of decoder circuits which activate a plurality of column switch lines in accordance with an initial column address and a burst length. Column switch lines may be activated synchronously with respective latch signals. A latch signal generating circuit can generate a plurality of latch signals synchronously with an external clock. The plurality of latch signals may be staggered so as to stagger the activation of tile plurality of column switch lines, thereby reducing on-chip noise as compared to a semiconductor memory device operating in a conventional multi-bit prefetch mode.

It is understood that embodiments described above have are exemplary and tile present invention should not be limited to those embodiments. For example, the number of bits prefetched may be a number other than 2 or 4 and the burst length may also be a number other than 4 as needed. Further, a semiconductor memory device according to the present invention may be in the form of other volatile or nonvolatile types such as Static Random Access Memories (SRAMs) or Read Only Memories (ROMs), as but two examples.

Although in the embodiments described, only one data signal DQ was illustrated for the semiconductor memory device. It should be known that the memory device can include wide-word parts, for example a×16, in which the memory cell array, column decoders, and internal I/O buses can be repeated 16 times. However, in such a case, the number of latch signals may or may not be increased depending on the level of noise suppression desired.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device configured to receive external control signals and external address signals synchronously with an external clock signal and permit data to be written/read synchronously with the external clock signal, comprising:
    a memory cell array divided into n memory cell segments where n is an integer greater than 1;
    a latch circuit that receives the external clock and generates a plurality of latch signals synchronously with the external clock signal, each latch signal being generated at a different time interval; and
    a plurality of address decoders, each address decoder receiving an internal address signal, generated from the external address signals, and one of the plurality of latch signals and generating a column switch signal synchronously with the received latch signal, to select data from one of the memory cell segments.

2. The semiconductor memory device of claim 1, wherein:
    the maximum time interval between adjacent latch signals is less than or substantially equal to the period of the external clock signal when data is write/read synchronously with a first edge of the external clock signal.

3. The semiconductor memory device of claim 1, wherein:
    the maximum time interval between adjacent latch signals is less than or substantially equal to one-half period of the external clock signal when data is write/read synchronously with a first and second edge of the external clock signal.

4. The semiconductor memory device of claim 1, wherein:
    the memory cell array is divided into n memory cell segments and n is an integer greater than 2; and
    the number of latch signals generated at a different time interval is less than n.

5. The semiconductor memory device of claim 1, wherein:
    the plurality of latch signals includes a first latch signal and a second latch signal, the second latch signal is a logical inversion of the first latch signal.

6. The semiconductor memory device of claim 1, wherein:
    the plurality of latch signals includes a first latch signal and a second latch signal; and
    the latch circuit includes a delay circuit, the delay circuit receives the first latch signal as an input and generates the second latch signal therefrom.

7. A semiconductor memory device, comprising:
    a clock circuit that receives an external clock signal as an input and generates a first and second latch signal, the first latch signal being generated at a different time interval than the second latch signal;
    a memory cell array divided into a first and second memory cell segment;
    a first and second internal I/O bus; and
    data from the first memory cell segment is transferred to the first internal I/O bus synchronously with the first latch signal and data from the second memory cell segment is transferred to the second internal I/O bus synchronously with the second latch signal.

8. The semiconductor memory device of claim 7, wherein:
    the data on the first and second internal I/O buses is sequentially output from the semiconductor memory device synchronously with the external clock signal.

9. The semiconductor memory device of claim 7, wherein:
    the first and second latch signals are pulses having a predetermined pulse width.

10. The semiconductor memory device of claim 7, further including:
    a first Y-address buffer decoder receiving an address and the first latch signal as an input, and activating one of a first group of column switch lines synchronously with the first latch signal;
    a second Y-address buffer decoder receiving the address and the second latch signal as an input, and activating one of a second group of column switch lines synchronously with the second latch signal;
    the first memory cell segment coupled to receive the first group of column switch lines, the first group of column switch lines addressing columns of cells in the first memory cell segment; and
    the second memory cell segment coupled to receive the second group of column switch lines, the second group of column switch lines addressing columns of cells in the second memory cell segment.

11. The semiconductor storage device of claim 7, wherein:
    the clock circuit further generates a third and fourth latch signal, the third latch signal being generated at a different time interval than the fourth latch signal;
    the memory cell array is further divided into a third and fourth memory cell segment;
    a third and fourth internal I/O bus; and
    data from the third memory cell segment is transferred to the third internal I/O bus synchronously with the third latch signal and data from the fourth memory cell segment is transferred to the fourth internal I/O bus synchronously with the fourth latch signal.

12. The semiconductor memory device of claim 11, wherein:

the first, second, third, and fourth latch signals are generated at different time intervals.

13. The semiconductor storage device of claim 11, wherein:

the first and third latch signals are generated at substantially the same time interval; and the second and fourth latch signals are generated at substantially the same time interval.

14. A semiconductor memory device, comprising:

a clock circuit that receives an external clock signal as an input and generates a first and second latch signal, the first latch signal being generated at a different time interval than the second latch signal;

a first Y-address buffer decoder receiving a column address and the first latch signal as an input, and activating one of a first group of column switch lines synchronously with the first latch signal;

a second Y-address buffer decoder receiving the column address and the second latch signal as an input, and activating one of a second group of column switch lines synchronously with the second latch signal;

a memory cell array divided into a first and second memory cell segments; and the first memory cell segment coupled to receive the first group of column switch lines, the first group of column switch lines addressing columns of cells in the first memory cell segment; and the second memory cell segment coupled to receive the second group of column switch lines, the second group of column switch lines addressing columns of cells in the second memory cell segment.

15. The semiconductor memory device of claim 14, wherein:

the first memory cell segment contains memory cells with even column addresses;

the second memory cell segment contains memory cells with odd column addresses.

16. A semiconductor memory device of claim 14, wherein:

the first latch signal is a pulse having a predetermined width.

17. The semiconductor device of claim 16, wherein:

the latch circuit includes a delay circuit having a signal propagation delay, the delay circuit receives the first latch signal as an input and outputs the second latch signal; and the second latch signal is a pulse generated at a predetermined time interval after the first latch signal wherein the time interval is determined by the signal propagation delay of the delay circuit.

18. The semiconductor device of claim 14, wherein:

the first latch signal is periodic having substantially the same period as the external clock signal; and the second latch signal is logically inverted with respect to the first clock signal.

19. The semiconductor device of claim 14, wherein:

the first clock signal is a pulse generated synchronously with a rising edge of the external clock signal; and the second clock signal is a pulse generated synchronously with the falling edge of the external clock signal.

20. The semiconductor device of claim 14, further including:

the clock circuit receives an enable signal, the enable signal enables the generation of the first clock signal when at one logic level and disables the generation of the first clock signal when at another logic level.

* * * * *